(12) United States Patent
Sun et al.

(10) Patent No.: US 7,782,622 B1
(45) Date of Patent: Aug. 24, 2010

(54) ATTACHMENT APPARATUS FOR ELECTRONIC BOARDS

(75) Inventors: Xiaohua H. Sun, Cupertino, CA (US); Ryan C. Tong, Palo Alto, CA (US)

(73) Assignee: NVIDIA Corporation, Santa Clara, CA (US)

( * ) Notice: Subject to any disclaimer, the term of this patent is extended or adjusted under 35 U.S.C. 154(b) by 817 days.

(21) Appl. No.: 11/538,553

(22) Filed: Oct. 4, 2006

(51) Int. Cl.
*H05K 7/20* (2006.01)

(52) U.S. Cl. .................. 361/719; 361/704; 257/718; 257/719; 165/80.3

(58) Field of Classification Search .................. None
See application file for complete search history.

(56) References Cited

U.S. PATENT DOCUMENTS

| | | | | |
|---|---|---|---|---|
| 6,480,387 B1* | 11/2002 | Lee et al. | ..................... | 361/704 |
| 6,611,431 B1* | 8/2003 | Lee et al. | ..................... | 361/719 |
| 6,625,022 B2* | 9/2003 | Frutschy et al. | ............. | 361/700 |
| 6,809,930 B2* | 10/2004 | Mueller et al. | ............. | 361/704 |
| 7,095,614 B2* | 8/2006 | Goldmann | ................... | 361/704 |
| 7,170,750 B2* | 1/2007 | Tanaka | ...................... | 361/719 |
| 7,190,586 B2* | 3/2007 | Franz et al. | ................. | 361/704 |
| 7,283,368 B2* | 10/2007 | Wung et al. | ................. | 361/719 |
| 7,460,371 B2* | 12/2008 | Andberg et al. | ............. | 361/704 |
| 2007/0047211 A1* | 3/2007 | Refai-Ahmed et al. | ...... | 361/720 |

* cited by examiner

*Primary Examiner*—Boris L Chervinsky
(74) *Attorney, Agent, or Firm*—Berkeley Law & Technology Group, LLP

(57) ABSTRACT

Disclosed is an attachment apparatus. The attachment apparatus may facilitate attachment of various components to a printed circuit board (PCB) including a thermal management component.

20 Claims, 6 Drawing Sheets

ATTACHMENT APPARATUS FOR ELECTRONIC BOARDS

BACKGROUND

1. Technical Field

The subject matter disclosed herein relates to attachment apparatus for electronic boards.

2. Information

Typically, a printed circuit board (PCB) that includes some form of integrated circuit (IC) device may also include a thermal management component for either the IC device, the PCB, a system within which the PCB is disposed, and/or any combination thereof. A common method of attaching the thermal management component may include a mechanical type method that may include springs and/or spring clips.

BRIEF DESCRIPTION OF THE DRAWINGS

Embodiments are illustrated by way of example and not by way of limitation in the figures of the accompanying drawings, in which like references may indicate similar elements and in which.

DETAILED DESCRIPTION

In the following description, embodiments will be disclosed. For purposes of explanation, specific numbers, materials, and/or configurations are set forth in order to provide a thorough understanding of the embodiments. However, it will also be apparent to one skilled in the art that the embodiments may be practiced without one or more of the specific details, or with other approaches, materials, components, etc. In other instances, well-known structures, materials, and/or operations are not shown and/or described in detail to avoid obscuring the embodiments. Accordingly, in some instances, features are omitted and/or simplified in order to not obscure the disclosed embodiments. Furthermore, it is understood that the embodiments shown in the figures are illustrative representations and are not necessarily drawn to scale.

References throughout this specification to "one embodiment" or "an embodiment" means that a particular feature, structure, material, and/or characteristic described in connection with the embodiment is included in at least one embodiment. Thus, the appearances of the phrases "in one embodiment" and/or "in an embodiment" in various places throughout this specification are not necessarily all referring to the same embodiment. Furthermore, the particular features, structures, materials, and/or characteristics may be combined in any suitable manner in one or more embodiments.

For the purposes of the subject matter disclosed herein, thermal management components may include a wide range of thermal management components such as, but not limited to, active cooling and passive cooling devices, and accordingly, the claimed subject matter is not limited to a particular type of thermal management component. Some examples of active cooling devices may include devices that may utilize gas, liquid, electricity, and any combination thereof. Active cooling devices may include devices such as, but not limited to, cooling fans, water cooled radiators, Peltier devices, and the like. Some examples of passive cooling devices may include devices such as, but not limited to, heat slugs, thermal fins, and the like.

PCBs may include PCBs such as, but not limited to, mother boards, video cards, and the like.

Figure 1A:
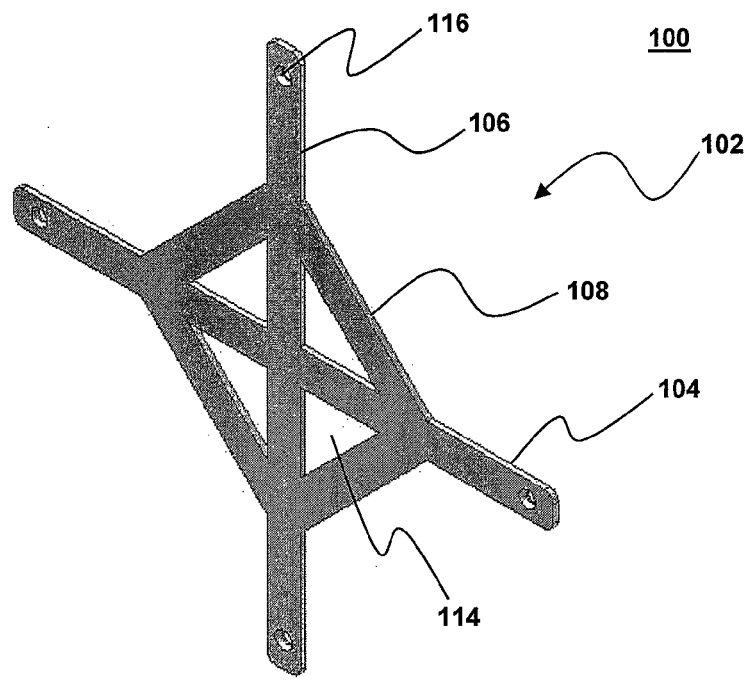
FIGS. 1A-1B illustrate an attachment apparatus in accordance with an embodiment.
Figure 1B:
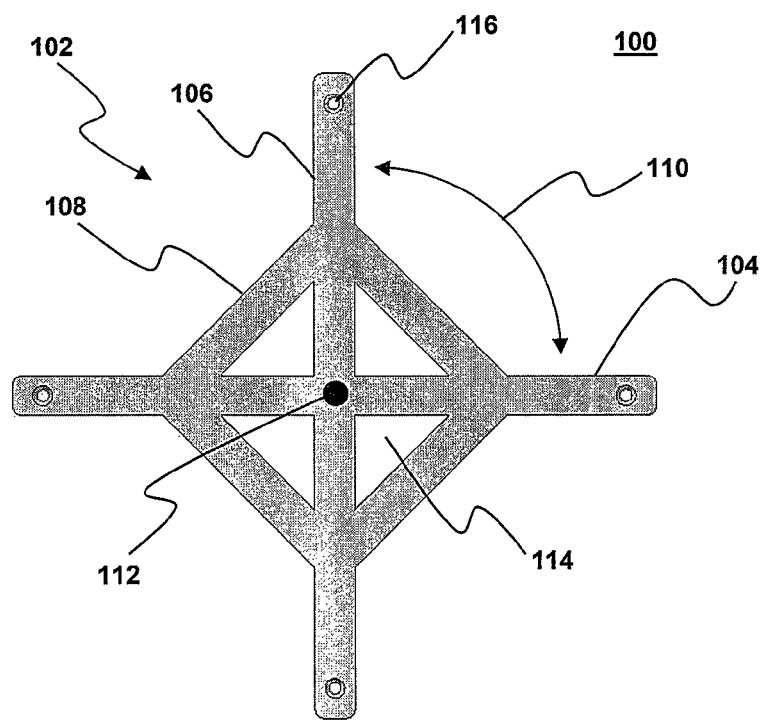

Turning now to the figures, FIGS. 1A-1B illustrate an attachment apparatus in accordance with one embodiment. In FIGS. 1A-1B, attachment apparatus 100 comprises a body 102, at least a first arm 104 and a second arm 106, and a ring 108.

First arm 104 and the second arm 106 may be configured to have a predetermined angle 110 relative to each other around a radial center 112, and accordingly, in the illustrated embodiment, the first arm 104 may be at 90 degrees relative to the second arm 106. Additionally, as illustrated in the embodiment, ring 108 may intersect the first arm 104 and the second arm 106 and be configured around the radial center 112. As shown, because the ring 108 intersects first arm 104 and second arm 106 around the radial center 112, open spaces 114 may also be present around the radial center 112. Further, attachment apparatus 100 may include attachment features 116, which may be located at distal ends of first arm 104 and second arm 106.

Shape and size of open spaces 114 may be at least related to a shape of the ring 108 and/or the number of arms 104 & 106. For example, in the illustrated embodiment of FIGS. 1A-1B, ring 108 may have a substantially rectangular shape while configured to intersect two arms 104 & 106, and accordingly result in four open spaces 114 having a substantially triangular shape. However, it should be appreciated that the claimed subject matter is not limited in scope in these respects.

Figure 2A:
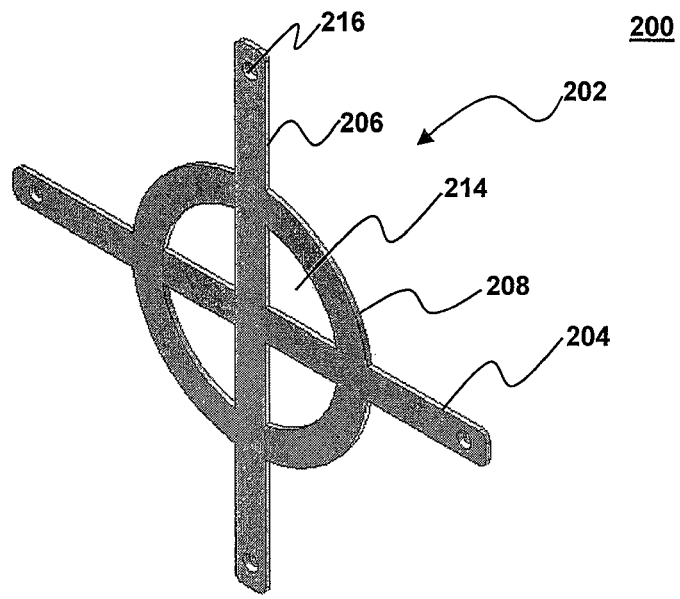
FIGS. 2A-2B illustrate an attachment apparatus in accordance with another embodiment.
Figure 2B:
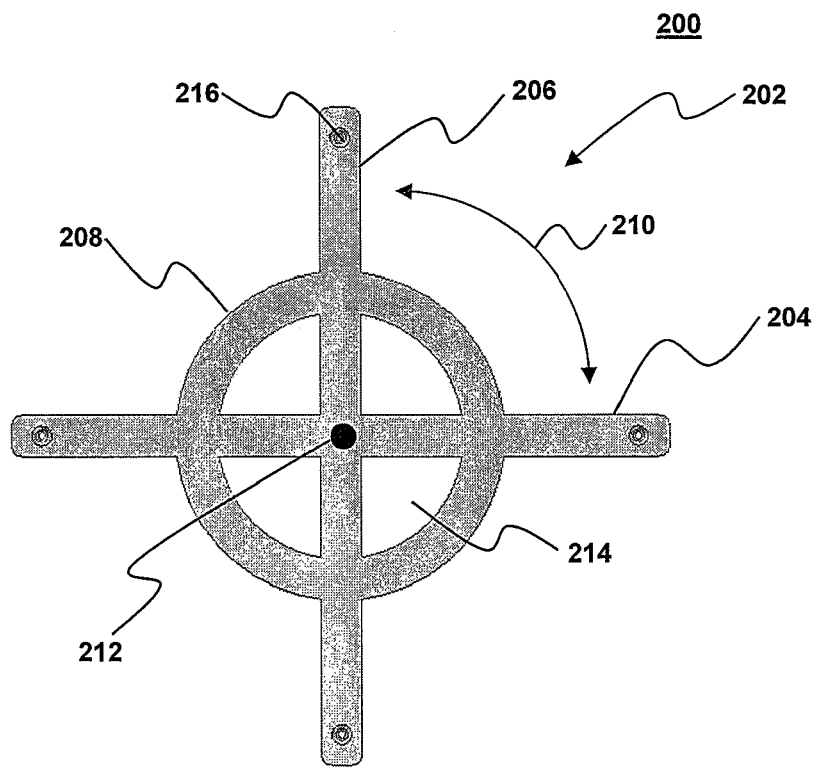

Before describing attachment apparatus in further detail, reference may be made to FIGS. 2A-2B to at least illustrate a wide variety of geometries that may be contemplated as being within the scope of the claimed subject matter. In FIGS. 2A-2B, as previously described, attachment apparatus 200 comprises a body 202, at least a first arm 204 and a second arm 206, and a ring 208.

Here again, first arm 204 and second arm 206 may be configured to have a predetermined angle 210 relative to each other around a radial center 212. In the illustrated embodiment, the first arm 204 may be 90 degrees relative to the second arm 206 around a radial center 212. Additionally, ring 208 may intersect first arm 204 and second arm 208 and configured around the radial center 212. As shown, because the ring 208 intersects first arm 204 and second arm 206 around the radial center 212, open spaces 214 may also be present around the radial center 212. Further, attachment apparatus 200 may include attachment features 216, which may be located at distal ends of first arm 204 and second arm 206 similar to the embodiment illustrated in FIGS. 1A-1B.

However, illustrated in the embodiment of FIGS. 2A-2B, shape and size of open spaces 214 may be at least related to a shape of the ring 208 and/or the number of arms 204 & 206. For example, ring 208 may have a substantially circular shape while configured to intersect the two arms 204 & 206, and as a result, four open spaces 214 may have substantially a pie shape. Here again, it should be appreciated that the claimed subject matter is not limited in scope in these respects.

It should be appreciated attachment apparatus 100 & 200 may have a variety of shapes and/or number of arms. That is, ring 108 & 208 may have a wide variety of shapes and the number of arms may be any number. Accordingly, the claimed subject matter is not limited in scope in these respects.

As will be described, in various embodiments, attachment apparatus 100 & 200 may comprise of a spring clip support type body. That is, attachment apparatus 100 may facilitate attachment of a thermal management component on a PCB.

Referring to FIGS. 1A-2B, in various embodiments, attachment apparatus 100 & 200 may comprise of a body capable of facilitating thermal conductivity. In one embodiment, attachment apparatus 100 & 200 may comprise of a metallic material such as, but not limited to, materials that may have a high electrical conductivity. Metallic materials may include metallic materials such as, but not limited to, aluminum, copper, iron, steel, silver, and the like. In another embodiment, attachment apparatus 100 & 200 may comprise non-metallic material such as, but not limited to, alumina based material, carbon based material, silicon carbide based material, and the like. Accordingly, attachment apparatus 100 & 200 may facilitate thermal conductivity.

In FIGS. 1A-2B, in yet another embodiment, attachment apparatus 100 & 200 may comprise a sheet body. For example, attachment apparatus 100 & 200 may comprise a sheet metal type body having a thickness of approximately 1 millimeter based at least in part on its application. Further, in FIGS. 1A-2B, predetermined angle 110 & 210 is illustrated as being substantially 90 degrees. However, it should be appreciated that predetermined angle 110 & 210 may comprise of any angle including any angle between 0 degrees to 180 degrees, in accordance with one embodiment. Accordingly, the claimed subject matter is not limited in these respects.

As previously alluded to, in various embodiments, attachment apparatus 100 & 200 may be capable of facilitating attachment of a thermal management component to a PCB. In one embodiment, the thermal management component may comprise a heat sink. In another embodiment, the heat sink may comprise a passive thermal management component. In another embodiment, the heat sink may comprise an active thermal management component. Examples of passive and active thermal management components may include a heat slug and a cooling fan respectively as previously described, and accordingly, claimed subject matter is not limited in scope in these respects.

Figure 3:
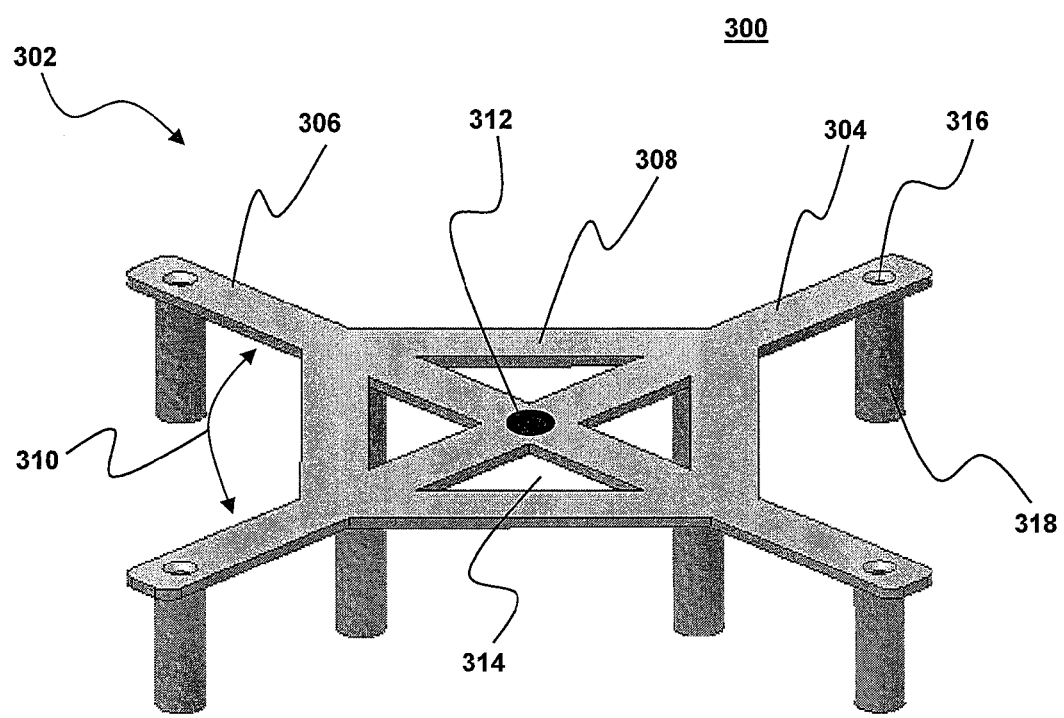
FIG. 3 illustrates an attachment method of an attachment apparatus in accordance with one embodiment.

Turning now to FIG. 3, an isometric view of an attachment apparatus 300 in accordance with an embodiment is illustrated. Attachment apparatus 300 may be similar to embodiment described in FIGS. 1A-1B. For example, attachment apparatus 300 may include a body 302. Body 302 may include at least first and second arms 304 & 306 configured to have a predetermined angle 310 relative each other around a radial center 312 (e.g., 90 degrees). Additionally, attachment apparatus 300 may include a ring 308 that intersect the first and second arms 304 & 306 and configured around the radial center 312 resulting in open spaces 314.

In the embodiment illustrated in FIG. 3, attachment apparatus 300 also may include attachment features 316 (e.g., holes). Disposed in substantial alignment with the attachment features 316 are a set offset stands 318. Offset stands 318 may be capable of facilitating offsetting of attachment apparatus 300 from a printed circuit board (PCB). It should be appreciated that offset stands may comprise of a variety of features that may help facilitate offsetting of an attachment apparatus from a PCB such as, but not limited to, metallic and/or non-metallic screw-in type stands. Further, the number of offset stands may vary widely based at least in part on the type of application. For example, an application that requires an increase in the number of electronic components to be disposed underneath the attachment apparatus 300 may require less offset stands 318. Accordingly the claimed subject matter is not limited to a particular approach.

Figure 4:
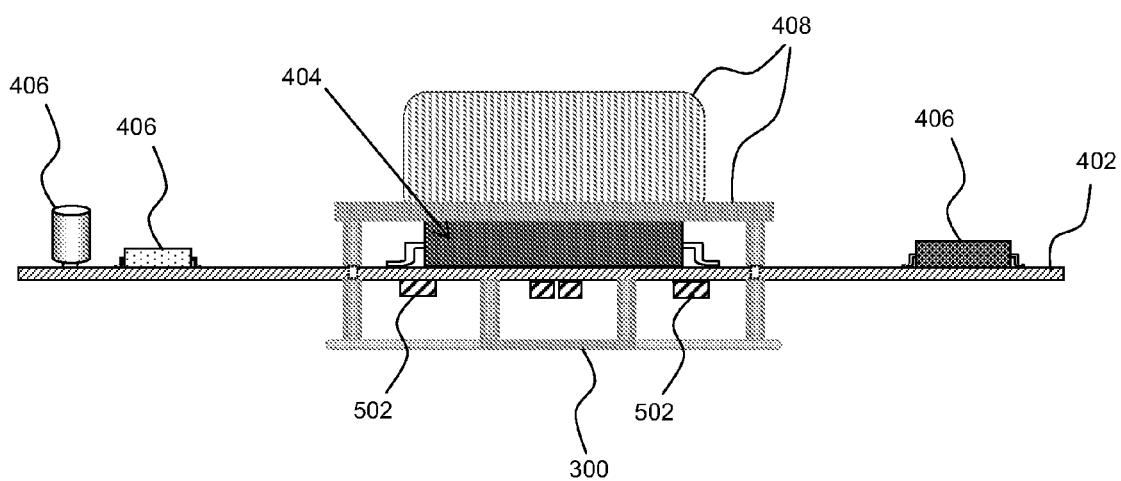
FIG. 4 illustrates an attachment apparatus disposed on a PCB in accordance with one embodiment.

FIG. 4 illustrates an attachment apparatus disposed on a PCB in accordance with one embodiment. As illustrated in FIG. 4, a PCB 402 may include various electronic components and/or devices such as, but not limited to, an integrated circuit (IC) device 404, a thermal management component 408, and various other electronic devices 406. In order to describe the claimed subject matter, references will be made to the IC device 404 and the thermal management component 408, and it should be appreciated that the other electronic devices 406 are shown for illustrative purposes, and accordingly, the claimed subject matter is not limited in these respects.

Continuing to refer to FIG. 4, attachment apparatus 300 is shown as being disposed on the PCB 402. Attachment apparatus 300 may be disposed on a side opposite IC device 404 to facilitate attachment of thermal management component 408 that may be disposed on IC device 404. For example, IC device 404 may have a thermal management component such as, but not limited to a cooling fan thermally coupled to IC device 404. Cooling fan may be mechanically attach to the PCB 402 by means such as, but not limited to, springs and/or spring type clips. In order to help facilitate the attachment of the cooling fan, attachment apparatus 300 may be disposed on the side opposite of IC device 404 on PCB 402 to help retain the springs and/or spring type clips as illustrated in FIG. 5.

Figure 5:
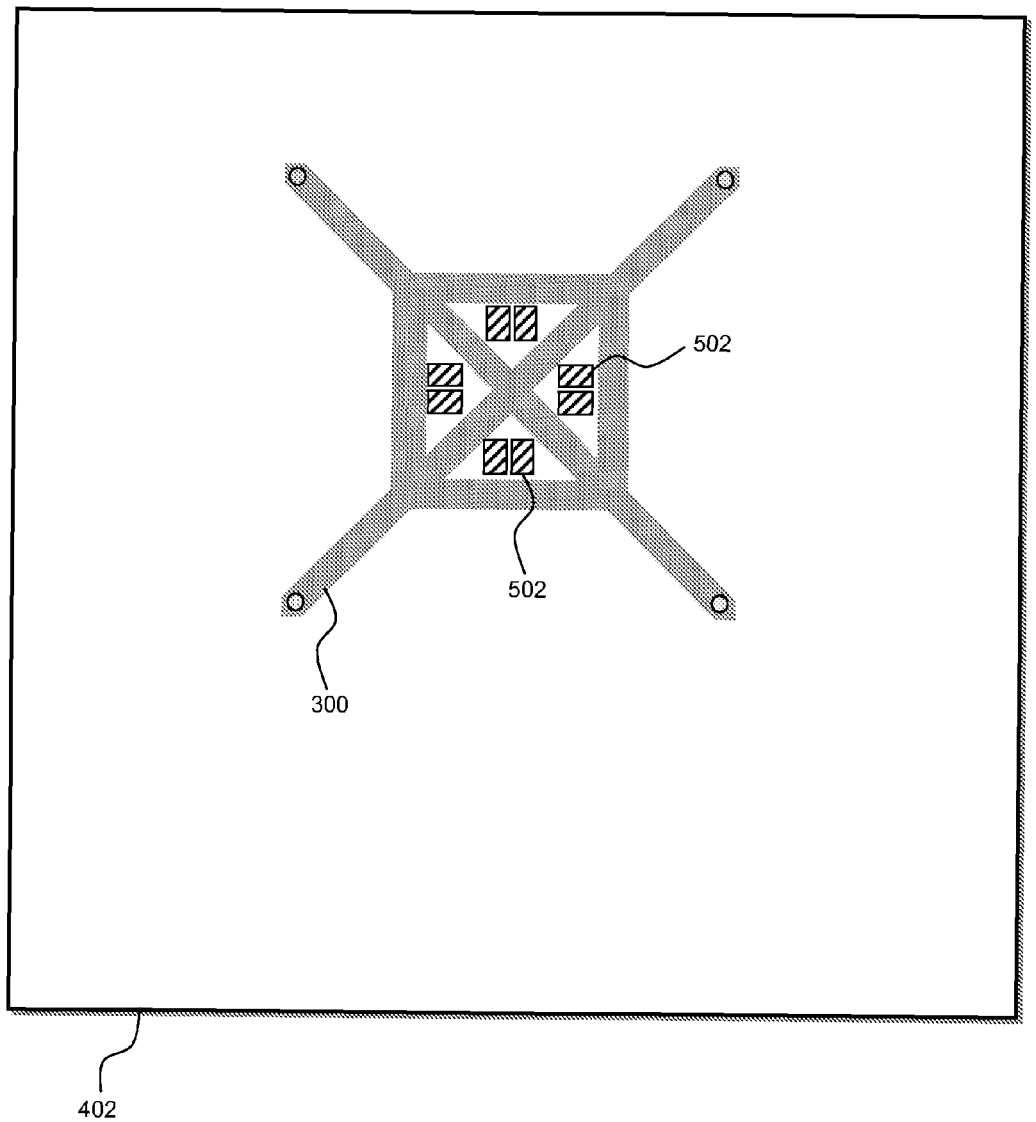
FIG. 5 illustrates a detailed view of an attachment apparatus attached to a PCB in accordance with another embodiment.

In FIG. 5, attachment apparatus 300 also facilitates placement of various electronic components 502 between the attachment apparatus 300 and PCB 402. In the embodiment illustrated in FIG. 5, attachment apparatus 300 includes a number of offset stands 318. However, as previously described, it should be appreciated that the number of offset stands may vary based at least in part on various electronic devices 502, and accordingly, the number of offset stands may be four. It should be appreciated that the number offset stands may vary while maintaining a desired strength and support for the thermal management component 408. That is an attachment apparatus may facilitate to attachment of a thermal management component to a PCB, in accordance with various embodiments.

As previously alluded to, PCB 402 may be any type of PCB such as, but not limited to, a PCB that may be utilized as a mother board in a computer system, a PCB that may be utilized as a peripheral daughter board such as, but not limited to, a video card. Accordingly, the claimed subject matter is not limited in these respects.

Figure 6:
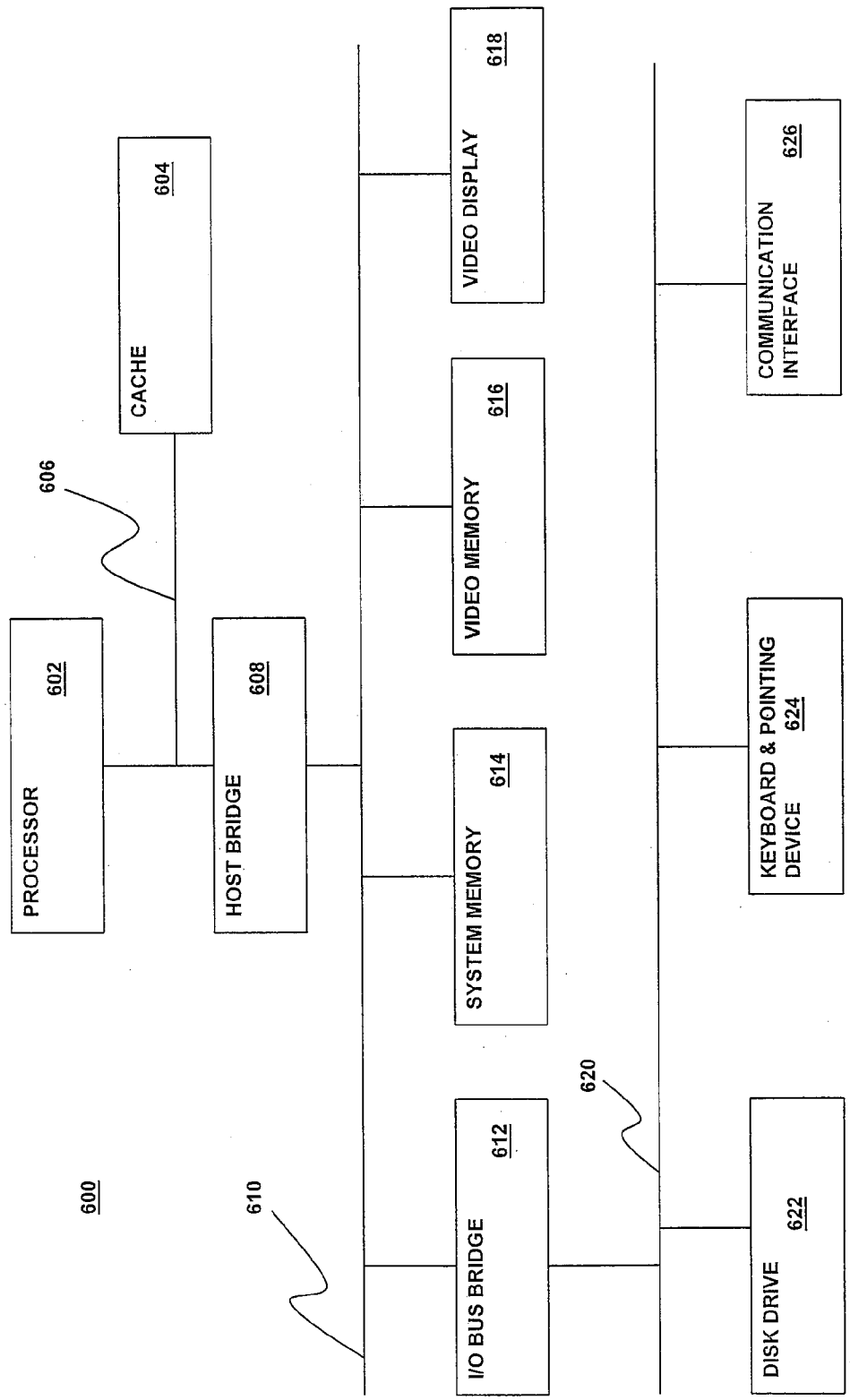
FIG. 6 illustrates an embodiment of a computer system having an attachment apparatus in accordance with one embodiment.

FIG. 6 illustrates block diagram of one embodiment of a computer system that may be suitable for having an attachment apparatus in accordance with various embodiments of the claimed subject matter. For the illustrated embodiment, computer system 600 may include a processor 602, a processor bus 606, a high performance I/O bus 610 and standard I/O bus 620. Processor bus 606, and high performance I/O bus 610 may be bridged by host bridge 608, whereas I/O buses 610 and 620 may be bridged by I/O bus bridge 612. Coupled to processor bus 606 may be cache 604. Coupled to high performance I/O bus 610 may be system memory 614 and video memory 616, against which video display 618 may be coupled. Coupled to standard I/O bus 620 may be disk drive 622, keyboard and pointing device 624, and communication interface 626.

These elements perform their conventional functions known in the art. In particular, video memory 616 may be included in a PCB such as, but not limited to, a video card. Video card may include an attachment apparatus to facilitate attachment of a thermal management component to the video card (i.e., potentially to a graphics processing unit). In addition, various components such as processor 602 may be included on another PCB such as, but not limited to, a motherboard. The motherboard may also include an attachment apparatus to facilitate attachment of a thermal management component to the motherboard (i.e., processor 602).

While there has been illustrated and/or described what are presently considered to be example embodiments of claimed subject matter, it will be understood by those skilled in the art that various other modifications may be made, and/or equivalents may be substituted, without departing from the true scope of claimed subject matter. Additionally, many modifications may be made to adapt a particular situation to the teachings of claimed subject matter without departing from subject matter that is claimed. Therefore, it is intended that the patent not be limited to the particular embodiments disclosed, but that it covers all embodiments falling within the scope of the appended claims.

What is claimed is:

1. An apparatus comprising:
   a first arm and a second arm extending from a radial center, the first and second arms having a predetermined angle relative to each other around the radial center; and
   a ring intersecting the first and second arms and configured around the radial center, the ring to intersect the first and second arms at points between the radial center and endpoints of the fist and second arms.

2. The apparatus of claim 1, the apparatus to facilitate attachment of a thermal management component on a printed circuit board.

3. The apparatus of claim 1, comprising a thermally conductive material.

4. The apparatus of claim 3, comprising a metallic material.

5. The apparatus of claim 3, comprising a non-metallic material.

6. The apparatus of claim 1, wherein the predetermined angle comprises substantially 90 degrees.

7. The apparatus of claim 1, wherein the ring comprises a substantially rectangular shape.

8. The apparatus of claim 1, wherein the ring comprises a substantially circular shape.

9. The apparatus of claim 1, wherein the predetermined angle comprises an angle within a range of substantially 0 degrees to substantially 180 degrees.

10. The apparatus of claim 1, comprising a material having a thickness of approximately 1 millimeter.

11. The apparatus of claim 1, further comprising one or more offset stands to offset the apparatus from a printed circuit board.

12. A system comprising:
    a printed circuit board;
    a thermal management component positioned on a first side of the printed circuit board;
    an attachment apparatus coupled to the thermal management component and disposed on a second side of the printed circuit board, the attachment apparatus having at least a first arm and a second arm extending from a radial center, the first and second arms configured to have a predetermined angle relative to each other around the radial center, and a ring intersecting the first and second arms and configured around the radial center, the ring to intersect the first and second arms at points between the radial center and endpoints of the fist and second arms; and
    a processor coupled to the thermal management component.

13. The system of claim 12, wherein the attachment apparatus comprises a thermally conductive material.

14. The system of claim 12, wherein the predetermined angle comprises substantially 90 degrees.

15. The system of claim 12, wherein the ring comprises a substantially rectangular shape.

16. The system of claim 12, wherein the ring comprises a substantially circular shape.

17. The system of claim 12, wherein the attachment apparatus further comprises one or more offset stands to offset the attachment apparatus from the printed circuit board.

18. The system of claim 12, wherein the thermal management component comprises a heat sink.

19. The system of claim 18, wherein the heat sink comprises a heat slug.

20. The system of claim 12, wherein the thermal management component comprises a cooling fan.

* * * * *